United States Patent
Gurdal et al.

(10) Patent No.: US 11,812,665 B1
(45) Date of Patent: Nov. 7, 2023

(54) HARD PIEZOELECTRIC CERAMIC COMPOSITION FOR MULTILAYER PIEZOELECTRIC TRANSFORMERS

(71) Applicant: QorTek, Inc., Williamsport, PA (US)

(72) Inventors: Ahmet Erkan Gurdal, State College, PA (US); Sinan Dursun, State College, PA (US); Safakcan Tuncdemir, State College, PA (US); Clive Randall, State College, PA (US)

(73) Assignee: QorTek, Inc., Williamsport, PA (US)

( * ) Notice: Subject to any disclaimer, the term of this patent is extended or adjusted under 35 U.S.C. 154(b) by 1,164 days.

(21) Appl. No.: 16/402,265

(22) Filed: May 3, 2019

Related U.S. Application Data

(60) Provisional application No. 62/669,504, filed on May 10, 2018.

(51) Int. Cl.
| | |
|---|---|
| H01L 41/107 | (2006.01) |
| C04B 35/499 | (2006.01) |
| C04B 35/622 | (2006.01) |
| C04B 35/64 | (2006.01) |
| H10N 30/40 | (2023.01) |
| H10N 30/053 | (2023.01) |
| H10N 30/50 | (2023.01) |
| H10N 30/87 | (2023.01) |
| H10N 30/853 | (2023.01) |

(52) U.S. Cl.
CPC .............. *H10N 30/40* (2023.02); *C04B 35/499* (2013.01); *C04B 35/62222* (2013.01); *C04B 35/64* (2013.01); *H10N 30/053* (2023.02); *H10N 30/505* (2023.02); *H10N 30/8554* (2023.02); *H10N 30/871* (2023.02); *H10N 30/872* (2023.02); *H10N 30/877* (2023.02); *C04B 2235/3203* (2013.01); *C04B 2235/3234* (2013.01); *C04B 2235/3255* (2013.01); *C04B 2235/326* (2013.01); *C04B 2235/3267* (2013.01); *C04B 2235/3296* (2013.01); *C04B 2235/442* (2013.01)

(58) Field of Classification Search
CPC ... H01L 41/107; C04B 35/499; H10N 30/8554; H10N 30/8548
See application file for complete search history.

(56) References Cited

U.S. PATENT DOCUMENTS

| | | | | |
|---|---|---|---|---|
| 6,274,966 | B1 * | 8/2001 | Kohno et al. | H01L 41/083 310/330 |
| 2014/0295138 | A1 | 10/2014 | Yan et al. | |

(Continued)

OTHER PUBLICATIONS

Dursun, S., et al., Abstract for "Material and device design for the high performance low temperature co-fired multilayer piezoelectric transformer," Sensors and Actuators A 286, 2019, 4-13.
Laoratanakul, P. et al., "Unipoled disk-type piezoelectric transformers," Jpn. J. Appl. Phys. Vol. 41, 2002, pp. 1446-50.
(Continued)

*Primary Examiner* — Matthew E. Hoban
(74) *Attorney, Agent, or Firm* — CAHN & SAMUELS, LLP

(57) ABSTRACT

A composition includes at least one Pb/Ni/Nb - Pb/Mg/W - Pb/Zr/Ti mixed oxide. A piezoelectric device may be made by providing at least two layers comprising the composition and coated with an outer electrode material; providing a plurality of layers comprising the composition and coated with an inner electrode material; combining or stacking a plurality of layers coated with inner electrode materials between two outer electrodes; and sintering or co-firing the inner electrode materials and outer electrode materials at a temperature at or below about 1000° C.

21 Claims, 16 Drawing Sheets

(56) References Cited

U.S. PATENT DOCUMENTS

2014/0375174 A1 12/2014 Yan et al.
2016/0149119 A1* 5/2016 Cho et al. ........ C04B 35/62685
310/365

OTHER PUBLICATIONS

Lin, D., et al., "Lead-free piezoelectric ceramic (K0.5Na0.5)NbO3 with MnO2 and K5.4Cu1.3Ta10O29 doping for Biezoelectric transformer application," Smart Mater. Struct. 17, 2008, 035002, pp. 1-6.

Liu. Effect of MnO2 doping on piezoelectric, dielectric and ferroelectric properties of PNN-PZT ceramics. Ceramics International41(2015)11359-11364 (Year: 2015).*

Priya, S., et al., "Multilayered unipoled piezoelectric transformers," Jpn. J. Appl. Phys., Vol. 43, 2004, pp. 3503-10.

Sun, H.L., "High power density NaNbO3-LiTaO3 lead-free piezoelectric transformer in radial vibration modes," Smart Mater. Struct. 24, 2015, 065017, pp. 1-8.

Wang, F., et al., "Multilayer rosen-type piezoelectric transformer prepared with Pb(Mg1/3Nb2/3)O3-PbTiO3 single crystal," J. Phys. D: Appl. Phys. 41, 2008, 035409, pp. 1-4.

Wang, Q., et al., "Note: High-power piezoelectric transformer fabricated with ternary relaxor ferroelectric Pb (Mg1/3Nb2/3)O3-Pb(In1/2Nb1/2)O3-PbTiO3 single crystal," Rev. Sci. Instrum. 87, 2016, 036105, pp. 1-3.

Yang, S.L., et al., "Effects of improved process for CuO-doped NKN lead-free ceramics on high-power piezoelectric transformers," IEEE Trans. Ultrason. Ferroelectr. Freq. Control., Vol. 58, 2011, pp. 2555-61.

Yoo, J., et al., "Electrical characteristics of high power piezoelectric transformer for 28 W fluorescent lamp," Sensors and Actuators A, Vol. 90, 2001, pp. 132-7.

Zhuang, Y., et al., "High power piezoelectric transformers with Pb(Mg1/3Nb2/3)O3-PbTiO3 single crystals," Appl. Phys. Express. 2, 2009, 121402, pp. 1-2.

* cited by examiner

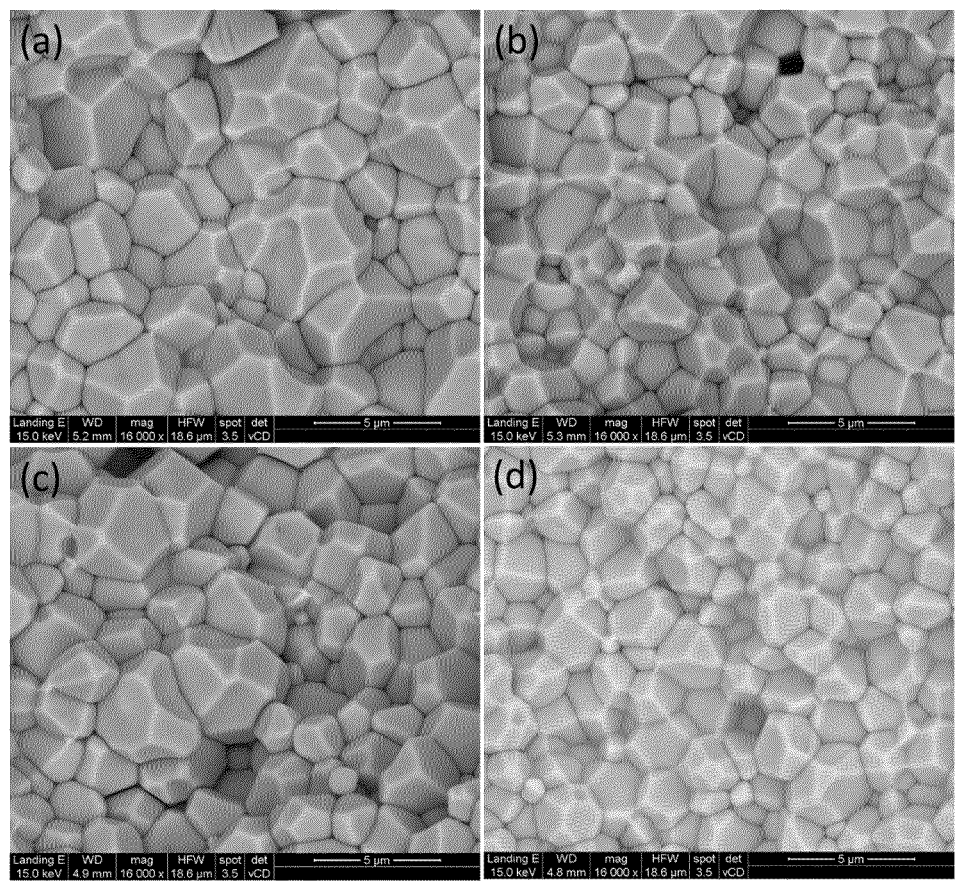
FIGS. 2a-d

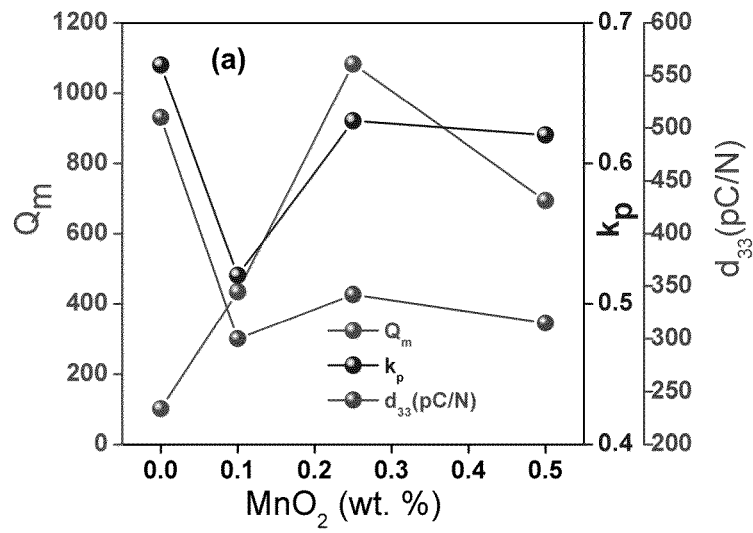
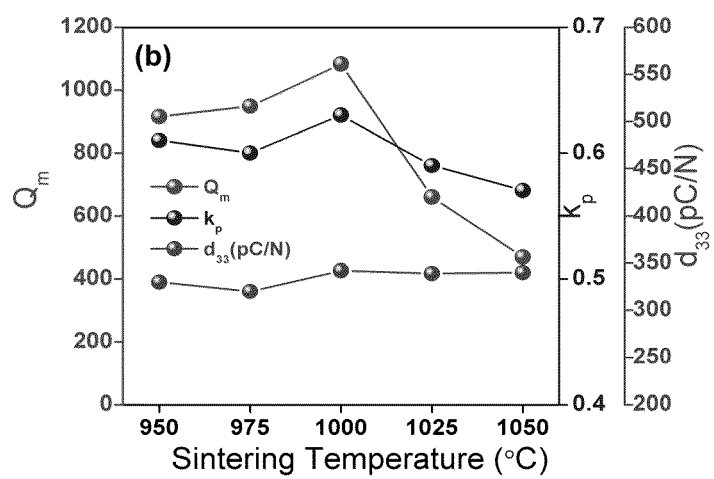
FIGS. 3a-b

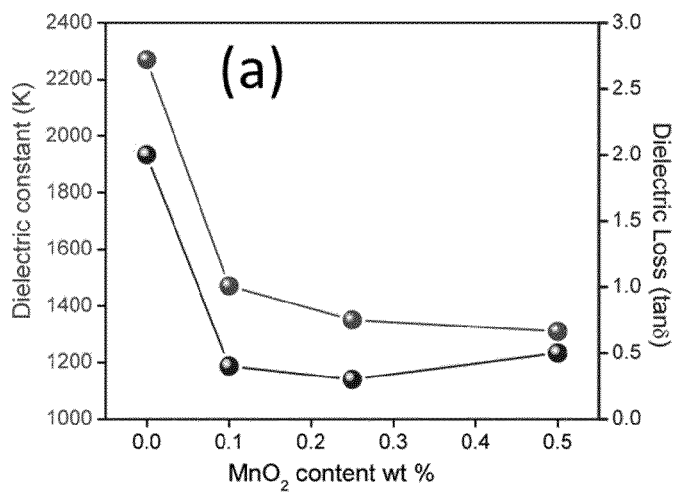
FIG. 5
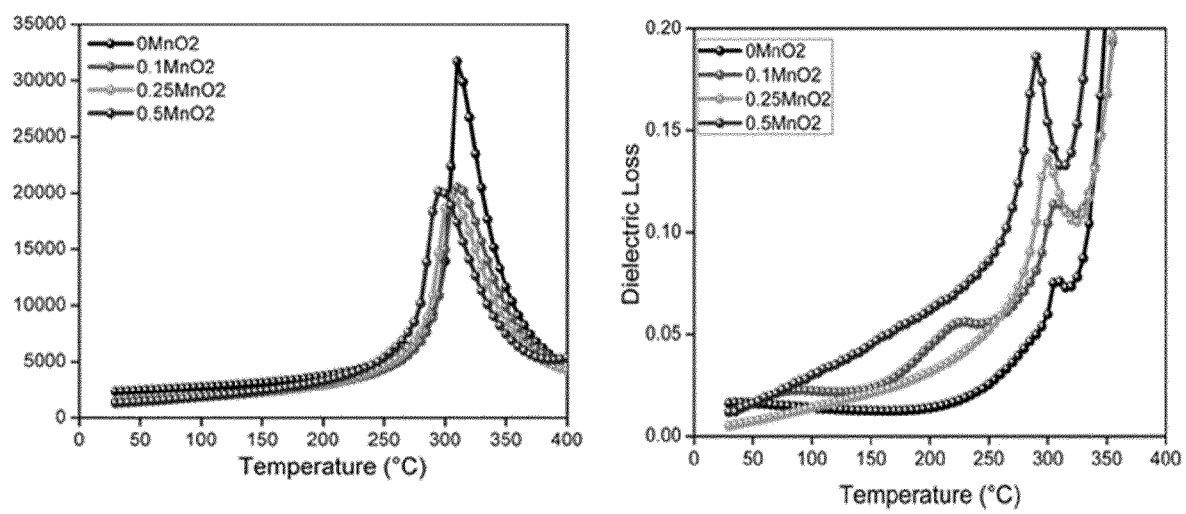
FIGS. 6a-b

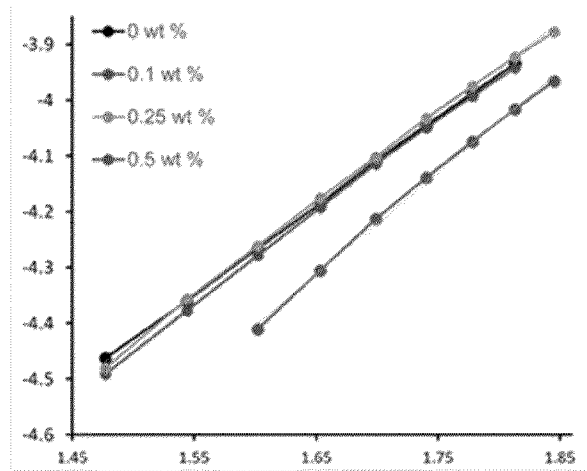
FIG. 7
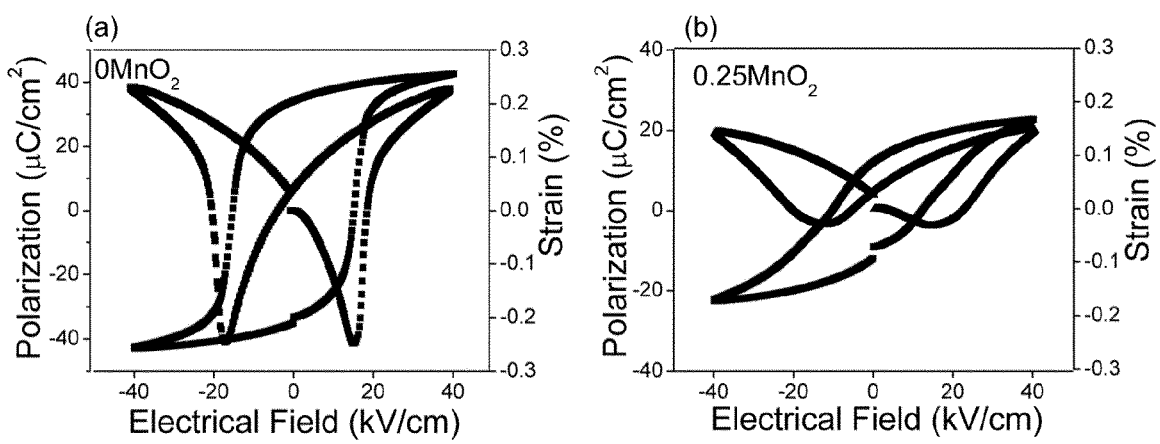
FIGS. 8a-b

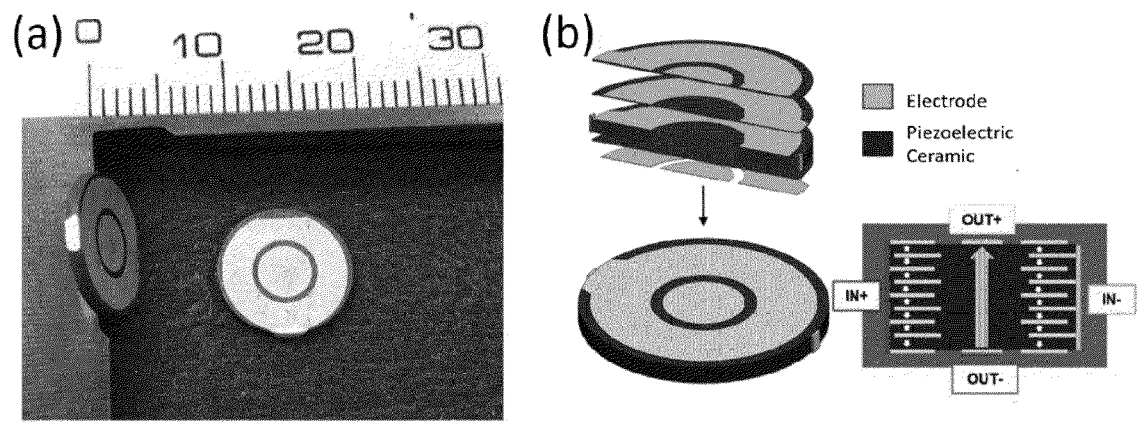
FIGS. 9a-b
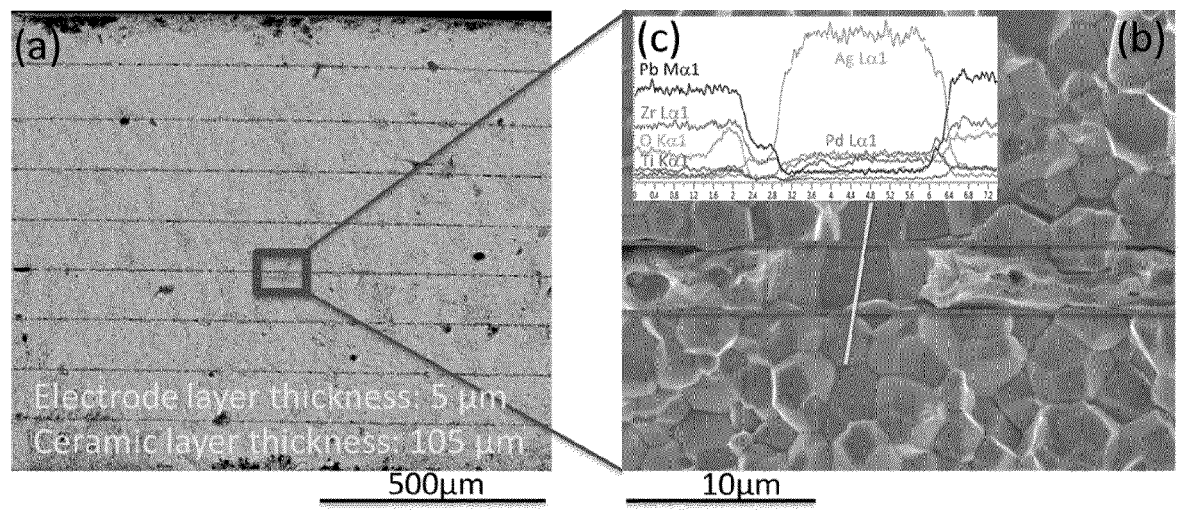
FIGS. 10a-c

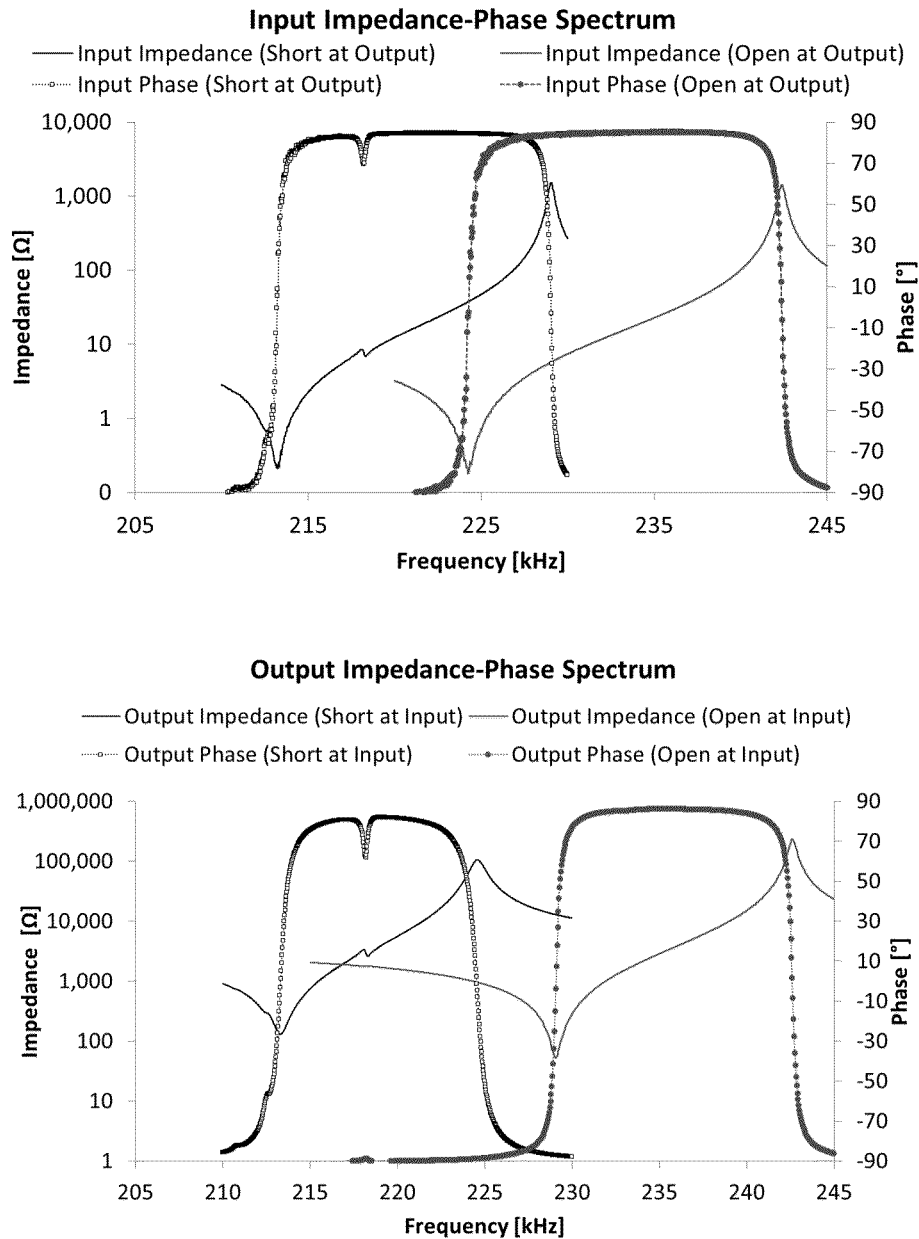
FIGS. 11a-b

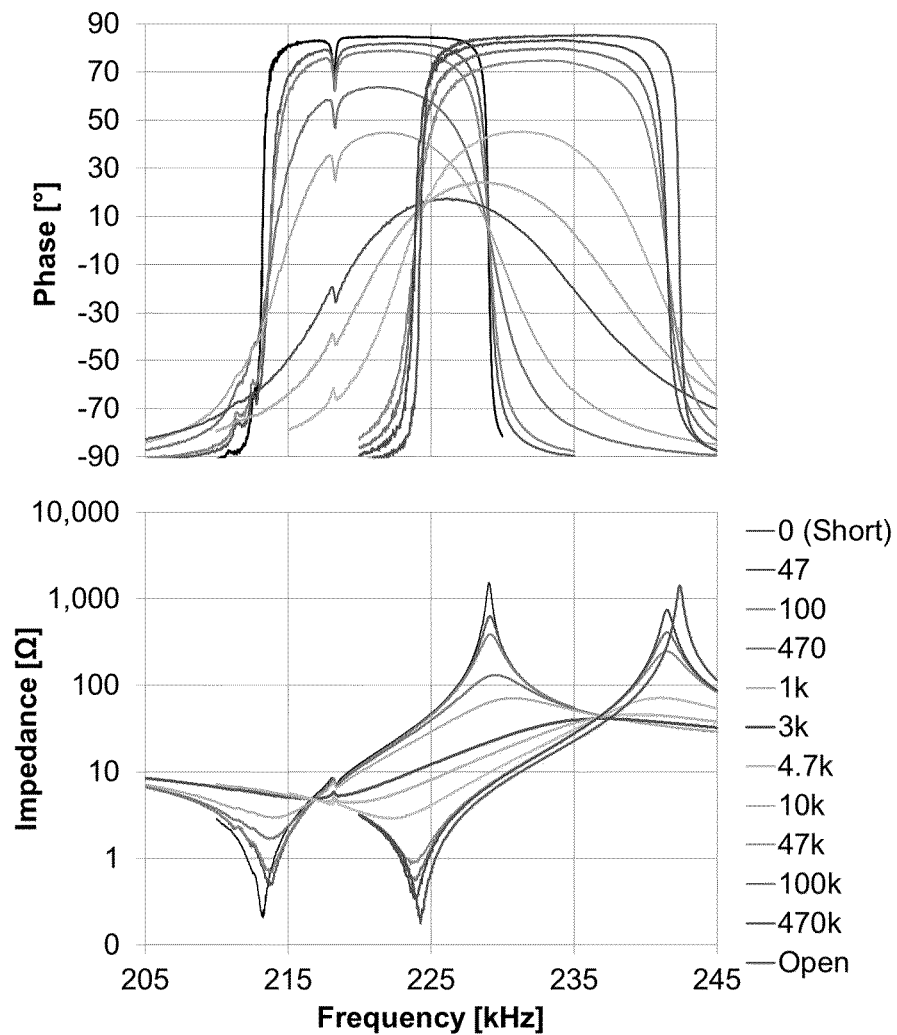
FIGS. 12a-b

HARD PIEZOELECTRIC CERAMIC COMPOSITION FOR MULTILAYER PIEZOELECTRIC TRANSFORMERS

This application claims priority to provisional application U.S. Serial No. 62/669,504 filed on 10 May 2018, the entirety of which is incorporated herein by reference.

This invention was made with government support under Contract No. 1632476 awarded by the National Science Foundation. The government has certain rights in the invention.

FIELD OF INVENTION

The present invention is directed to a hard piezoelectric ceramic compositions and to processes for producing piezoelectric transformers. Specifically, the present invention is directed to Pb/Ni/Nb-Pb/Mg/W-Pb/Zr/Ti mixed oxide ("PNN-PMW-PZT") piezoelectric materials, which deliver excellent hard piezoelectric properties at a favorable cost.

BACKGROUND OF INVENTION

A piezoelectric transformer (PT) is a capacitive energy transfer device in which electrical energy is converted to acoustic energy at an input section, and the acoustic energy is simultaneously converted back to electrical energy at an output section.

Although piezoelectric ceramics have been widely used as actuators, transducers, and sensors, the main application of piezoelectric transformers had been as backlight inverters in LCD displays for portable devices; now discontinued due to the advent of LED displays. There is however a growing market for PTs from defense and space industry due to their wide operating temperature capabilities, fast charging, and high step-up gain capability as compared with traditional electromagnetic devices. Piezoelectric transformers are highly radiation inert and highly immune to electromagnetic interference so as to reduce the burden of shielding in radiation-exposed and extreme environment applications. These advantageous features can be especially important for missile and space applications where size and weight can be paramount.

There are two possible approaches to improvements in PT device power handling capability. The first approach is to optimize hard-type piezoceramic materials to decrease material losses and enhance coupling at high vibration velocity and thus improve efficiency and power handling capacity of such PTs. The second approach is to implement co-fired multilayer structures to increase power density of PT. The practical challenge in implementing the second option is that multilayer construction increases the cost of the PT device significantly due to the high cost of inner electrode materials that are comprised of rare metals such as Platinum (Pt). The solution is to replace expensive rare metal innerlayer electrode materials, such as Pt, with low cost Ag-alloys or Cu. Such a solution is attractive, but is challenging because the sintering temperature of hard-type piezoceramics is typically too high (>1100° C.) to be applicable for cofiring with Ag-alloys. Copper and Ag/Cu electrodes cannot survive such elevated temperature exposure.

The present invention is for a piezoceramic composition that meets four criteria: (a) It is a hard-type piezoceramic material; (b) It can be sintered at temperatures at or below about 1000° C.; (c) It is amenable to base metal electrode cofiring; and (d) It exhibits high-performance metrics; specifically high performance in transfer of input power to output power.

SUMMARY OF INVENTION

The present invention is directed to a hard-piezoelectric ceramic composition and several engineering processes for these compositions. The compositions of the present invention allow for co-fired multilayer piezoelectric transformers that can be sintered at temperatures at or below about 1000° C. This low temperature sinter capability that enables introduction of low-cost metallization materials, for example, nickel, copper, silver, palladium, alloys thereof, and combination thereof. According to the present invention, PNN-PMW-PZT compositions deliver excellent hard piezoelectric properties (e.g., $Q_m$=1150, $k_p$=0.63, tan δ=0.25%, $d_{33}$=350 pC/N, K=1400 and Tc=325° C.) at reduced manufacture costs due to this ability to use low cost metallization materials.

The invention provides in a first embodiment a composition comprising at least one Pb/Ni/Nb - Pb/Mg/W - Pb/Zr/Ti mixed oxide.

The invention provides in a second embodiment further to any of the previous embodiments a composition comprising a Pb/Ni/Nb - Pb/Mg/W - Pb/Zr/Ti mixed oxide, modified or doped with at least one of $MnO_2$ or a rare earth metal oxide.

The invention provide in a third embodiment further to any of the previous embodiments a composition comprising $Pb(Ni_{1/3}Nb_{2/3})O_3$-$Pb(Mg_{1/2}W_{1/2})O_3$-$Pb(Zr_{0.50}Ti_{0.50})O_3$ + x $MnO_2$, wherein x is from 0 to about 0.5 wt.%, based on the weight of the composition.

The invention provides in a fourth embodiment further to any of the previous embodiments a composition comprising a Pb/Ni/Nb - Pb/Mg/W - Pb/Zr/Ti mixed oxide comprising $Li_2O_3$ and $CaCO_3$.

The invention provides in a fifth embodiment further to any of the previous embodiments a composition comprising a Pb/Ni/Nb - Pb/Mg/W - Pb/Zr/Ti mixed oxide comprising excess PbO.

The invention provides in a first method embodiment a method of making a multilayer piezoelectric device comprising providing a plurality of layers comprising a composition comprising a Pb/Ni/Nb- Pb/Mg/W - Pb/Zr/Ti mixed oxide and coated with an outer electrode material; providing a plurality of layers comprising a composition comprising a Pb/Ni/Nb - Pb/Mg/W - Pb/Zr/Ti mixed oxide and coated with an inner electrode material; combining or stacking a plurality of layers coated with inner electrode materials between two outer electrodes; and sintering or co-firing the inner electrode materials and outer electrode materials at a temperature at or below about 1000° C.

The invention provides in a second method embodiment further to any of the previous method embodiments a method of making a multilayer piezoelectric device in which the piezoelectric device is a ring-dot piezoelectric transformer or a Rosen transformer.

The invention provides in a third method embodiment further to any of the previous method embodiments a method of making a multilayer piezoelectric device wherein the inner electrode material comprises at least one of Ag, Pd, Cu, alloys thereof, or combinations thereof.

The invention provides in a fourth method embodiment further to any of the previous method embodiments a method of making a multilayer piezoelectric device wherein the sintering is accomplished in a reducing atmosphere having $pO_2$ from $10^{-15}$ to $10^{-1}$ atm.

The invention provides in an embodiment a multilayer piezoelectric device formed according to any of the previous method embodiments.

The invention provides in an embodiment a multilayer piezoelectric device that may comprise and form a sensor, a transformer, or a transducer.

In the detailed description, references to "one embodiment", "an embodiment", or "in embodiments" mean that the feature being referred to is included in at least one embodiment of the invention. Moreover, separate references to "one embodiment", "an embodiment", or "embodiments" do not necessarily refer to the same embodiment; however, neither are such embodiments mutually exclusive, unless so stated, and except as will be readily apparent to those skilled in the art. Thus, the invention can include any variety of combinations and/or integrations of the embodiments described herein.

As used herein "substantially", "generally", and other words of degree are relative modifiers intended to indicate permissible variation from the characteristic so modified (e.g., ±0.1%, ±0.5%, ±1.0%, ±2%, ±5%, ±10%, ±20%). It is not intended to be limited to the absolute value or characteristic which it modifies but rather possessing more of the physical or functional characteristic than its opposite, and preferably, approaching or approximating such a physical or functional characteristic.

BRIEF DESCRIPTION OF THE DRAWINGS

FIGS. 2a-d are SEM photographs showing microstructures of fracture surface PNN-PMW-PZT composition with/without Mn-doped sintered at 1000° C. for 2 hours: (a) 0 wt.% (FIG. 2a), 0.1 wt.% (FIG. 2b), 0.25 wt.% (FIG. 2c), and 0.5 wt.% (FIG. 2d).

FIGS. 3a-b are graphs showing electromechanical and piezoelectric properties of the PNN-PMW-PZT composition as a function of $MnO_2$ content sintered at 1000° C. for 6 hours (FIG. 3a); and the PNN-PMW-PZT composition with 0.25 wt% $MnO_2$ as a function of sintering temperature (FIG. 3b).

FIG. 5 is a graph showing relative permittivity (K) and dielectric loss (tan δ) of the PNN-PMW-PZT composition with different $MnO_2$ doping at room temperature.

FIGS. 6a-b are graphs showing temperature dependence of dielectric constant (FIG. 6a) and dielectric loss (FIG. 6b) of PNN-PMW-PZT composition for varying amounts of $MnO_2$ dopant.

FIG. 7 is a graph showing $\ln(1/\varepsilon - 1/\varepsilon_{max})$ versus $\ln(T - T_{max})$ for the PNN-PMW-PZT ceramic where it incorporates $MnO_2$ doped PNN-PMW-PZT compositions at differing $MnO_2$ doping levels.

FIGS. 8a-b are graphs showing electrical field induced polarization (P-E) and bipolar strain (x-E) hysteresis of undoped (FIG. 8a) and doped (FIG. 8b) versions of the PNN-PMW-PZT ceramic composition.

FIGS. 9a-b show a 10 mm OD, 1 mm thick PT (FIG. 9a, photo on left) and poling directions and terminal connections (FIG. 9b, schematic diagram on right) of the high step-up ratio planar-mode piezoelectric transformer comprised of the PNN-PMN-PZT ceramic composition.

FIGS. 10a-c show cross-sectional views from a fractured surface of a ring dot step up multilayer piezotransformer structure that is co-fired at 1000° C. for 2 hours showing (FIG. 10a) its multilayer structure, (FIG. 10b) the interface between ceramic grains and Ag/Pd fired electrode, and (FIG. 10c) an EDS mapping taken around the ceramic-metal interface.

FIGS. 11a-b are graphs showing impedance and phase spectra of the input (top) and output (bottom) terminals of the PNN-PMW-PZT composition transformer devices at open and short circuit conditions.

FIGS. 12a-b are graphs showing the effect of electrical loading on the input impedance and phase of the PNN-PMW-PZT devices as a function of the electrical loading at the output.

DETAILED DESCRIPTION OF THE INVENTION

Figure 1:
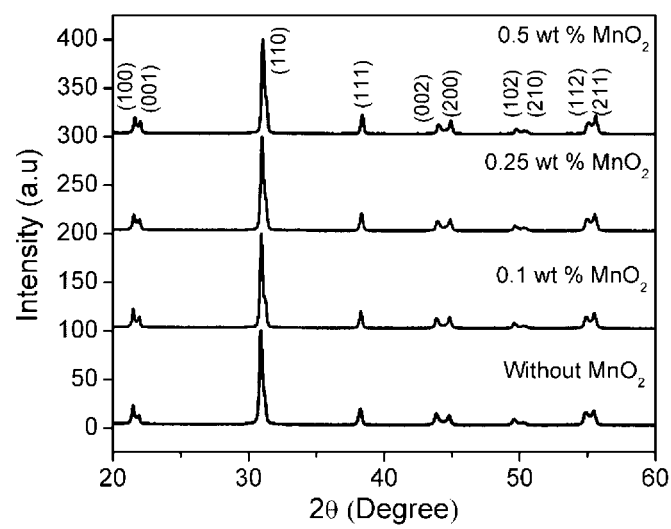
FIG. 1 is a graph showing X-ray diffraction patterns of a PNN-PMW-PZT composition as a function of $MnO_2$ doping level.

Piezoelectric devices of the present invention comprise hard-type piezoceramic compositions comprising at least one Pb/Ni/Nb - Pb/Mg/W - Pb/Zr/Ti mixed oxide ("PNN-PMW-PZT"). In various embodiments, a composition comprising PNN-PMW-PZT may be modified or doped with at least one of $MnO_2$ or a rare earth metal oxide (e.g., an oxide of erbium, cerium, dysprosium, europium, gadolinium, holmium, lanthanum, lutetium, neodymium, praseodymium, promethium, samarium, scandium, terbium, thulium, ytterbium, or yttrium).

The resulting hard materials are suitable for dynamic/on-resonance applications, where the high mechanical quality factor determines the amplification of the deflection at resonance. Such hard materials can withstand high level of electrical excitation and mechanical stress and are not easy poled or de-poled except at elevated temperature. Devices manufactured from such ceramic compositions meet the need for high mechanical quality factor ($Q_m$), which represents strain performance at its fundamental resonant frequency and low dielectric losses (tanδ) performance factors. High electromechanical coupling ($k_p$, $k_t$), piezoelectric response ($d_{33}$) and Curie temperature are also desired material parameters.

According to the present invention, the PNN-PMW-PZT hard-piezoelectric ceramic compositions allow for co-fired multilayer piezoelectric transformers that can be sintered at temperatures at or below about 1000° C. and that enable introduction of low cost metallization materials, for example, nickel, copper, silver, palladium, alloys thereof, and combinations thereof. According to the present invention, $MnO_2$-modified or doped PNN-PMW-PZT compositions deliver excellent hard piezoelectric properties (e.g., $Q_m$=1150, $k_p$=0.63, tan δ=0.25%, $d_{33}$=350 pC/N, K=1400 and Tc=325° C.) at low costs due to their ability to use low cost metallization materials.

A. Composition and Preparation

According to a specific embodiment of the present invention, a PNN-PMW-PZT composition is introduced using the following formula: $0.08Pb(Ni_{1/3}Nb_{2/3})O_3 - 0.02Pb(Mg_{1/2}W_{1/2})O_3 - 0.90Pb(Zr_{0.50}Ti_{0.50})O_3$. This formulation may be further doped with $xMnO_2$, wherein x is from 0 to about 5 wt. %, for example, 0.1, 0.25, or 0.5 wt% of the composition. In specific embodiments, the PNN-PMW-PZT composition may contain one or more sintering aids, wherein these sintering aids include, but are not limited to, $Li_2O_3$ and $CaCO_3$ in amounts of about 0.2 wt% and about 0.3 wt%, respectively.

The PNN-PMW-PZT composition according to the present invention may be fabricated using conventional mixed oxide processes with different amounts of $MnO_2$. See, for example, Dursun et al., Material and device design for the high performance low temperature co-fired multilayer piezoelectric transformer, Sensor and Actuators: A 286 (2019) 4-13, the entirety of which is incorporated herein by reference. To prepare the PNN-PMW-PZT composition, in specific embodiments, raw oxides and carbonates PbO (ALFA AESAR, 99.5%), MgO (ALFA AESAR, 99%), $WO_3$ (ALFA AESAR, 99%), NiO (ALFA AESAR, 99%), $Nb_2O_5$ (ALFA AESAR, 99.5%), $ZrO_2$ (ALFA AESAR, 99%), $TiO_2$ (ALFA AESAR, 99%), $Li_2CO_3$ (ALFA AESAR, 99%), and $CaCO_3$ (ALFA AESAR, 99%), $MnO_2$ (ALFA AESAR, 99%) were weighted by molar ratio according to the chemical formula and mixed by ball-mill with YSZ in Et-OH for 24 hours. To achieve this fabrication, the mixed powders were calcined at 780° C. for 4 hours and ball-milled for 24 hours again to decrease particle size and eliminate the agglomerates. Subsequent to the milling process, the resulting dried powder was mixed with 1.5 wt% Paraloid in acetone solution with ball-mill for 6 hours. The resulting compositional powder of the present invention was sieved and then pressed in a uniaxial manner as to yield disks shape pellets, for example with diameter of 12.5 mm. To achieve binder burn-out the compositional pellet were exposed to 550° C. ambient for 2 hours as to remove the polymer binder, the resulting samples were sintered in the range of 900° C. to 1100° C. for 2 hours. Resulting sintered disks were subsequently polished, printed with inexpensive metal electrodes and then fired at 590° C. for 15 minutes. These fired piezoceramics were subsequently poled in oil at 120° C. under an electric field of 3 kV/mm for 15 minutes. The resulting poled ceramics were then aged for 24 hours prior to electrical characterization.

According to the present invention, the PNN-PMW-PZT composition may be used to form a piezoelectric device including, but not limited to, a piezoelectric transformer (PT), sensor, or transducer. In a specific embodiment, a PT may comprise an annular step-up multilayer piezoelectric transformer comprising two separated (e.g., inner and outer) electrode regions symmetrically either side of each layer in the multilayer construction. These PTs are often referred to as "ring-dot" transformers. Other such planar electroding geometries are similarly achievable that may also have two or more distinct electrode regions separated by non-conductive regions possibly consisting of bare, non-electroded regions.

In another specific embodiment, a PT may comprise a rectangular shape step-up multilayer piezoelectric transformer comprising two separated regions on each end of the rectangular multilayer construction. These PT's are often referred to as "Rosen" transformers. The results and advantages identified for the "ring-dot" transformers apply to other PT geometries including, but not limited to, Rosen transformers.

According to the present invention, such PTs provide a class of low-temperature sinter-capable, hard-type transformers that are in a compact form and that meet high power application needs, as for example, satellite, munition or missile power supply needs. A ring-dot step-up multilayer piezoelectric transformer construction, according to an embodiment of the present invention, may employ a low atmosphere co-firing process that incorporates, for example, Ag/Pd in order to achieve the target hard-type properties. Manganese oxide, $MnO_2$, is here introduced as a hardening dopant, while $CaCO_3$ and $Li_2O_3$, in specific embodiments, may be introduced to enable low temperature sintering, enabling the use of low temperature metallics as the electrode materials.

B. Advantages of the Present Invention

According to the present invention, the PNN-PMW-PZT composition may be co-fired with inexpensive metal inner electrodes in structures such as a planar-type, ring-dot multilayer step-up piezoelectric transformer that demonstrate both high gain and high-power density when compared to other PT devices. (see Table 1 below).

To demonstrate this, sample PT devices having the PNN-PMW-PZT composition according to the present invention were fabricated in disk form of 1 mm thickness and 10 mm diameter as to provide a 6.7 step up ratio. These devices delivered 3 W output power at 92% power efficiency, while the temperature increase from ambient is below 40° C. The actual measurements show that devices manufactured from the inventive composition using the dopant and sintering aid steps introduced result in a very high-power density capability.

TABLE 1

Summary of step up piezoelectric transformers based on characteristics

| Reference | Material Type | $T_{sinter}$(°C) | Transformer Type | Power Density [W/cm3] | ΔT [°C] | Efficiency [%] | Gain |
|---|---|---|---|---|---|---|---|
| Yoo et al. 2001 | PNW-PMN-PZT Polycrystalline | - | Planar (Disk) | 12.5 | 15.6 | 97 | 1.1 |
| Laoratanakul et al. 2002 | APC841 | 1280 | Planar (Disk) | 18.5 | 15 | 80 | 2.4 |
| Priya et al. 2004 | APC841 | 1280 | Planar (Disk) | 25.1 | 18 | 97 | 1.8 |
| Lin et al. 2008 | KNN | 1100 | Planar (Square) | 10 | 20 | 96 | 6 |
| Yang et al. 2011 | NKN | 1100 | Planar (Disk) | 18.3 | 3 | 94 | 3 |
| Sun et al. 2015 | NN-LT | 1330 | Planar (Disk) | 32.8 | 27 | 92 | 4.5 |
| Present Invention | PNN-PMW-PZT | 1000 | Planar (Disk) | 12.7 | 13 | 94 | 6.7 |
| | | | | 25.5 | 29 | 93 | 6.7 |
| | | | | 38.2 | 39 | 92 | 6.7 |
| Wang et al. 2016 | PMN-PIN-PT Single Crystal | - | Rosen | 50 | 5 | 95 | 1.2 |
| Wang et al. 2009 | PMN-PT | - | Rosen | 5.8 | 10 | 92 | 15 |
| Zhuang et al. 2009 | PMN-PT | - | Rosen | 38 | 10 | 90 | 1.9 |

C. Fabrication of Multilayer Co-Fired Devices Using Low Temperature Sintering And Metallization According to the present invention, in specific embodiments, sintering of multilayer PNN-PMW-PZT samples is performed at or below about 1000° C. for 2 hours with covered alumina crucible. This sintering allows for use of low cost metallization (e.g., inner layer electrode). Terminals of the resulting transformers were then polished to expose the electrodes and then terminated with inexpensive metal termination electrode materials at 590° C. for 15 minutes. Then input and output sections were poled separately according to selection of individual ceramic thicknesses.

D. Material and Electrical Characterization

Post manufacture phase and microstructure analysis of bulk sample were carried out with X-ray diffraction (PANalytical Empyrean X-Ray Diffractometer), scanning electron micrographs (SEM) and EDS mapping (FEI Nova Nano-SEM 630 SEM) reveals behavior of target key metrics. The room temperature dielectric loss and capacitance of ceramics and PTs were measured at 1 kHz and 1 V with an LCR meter (HP 4772A, LCR meter). The piezoelectric charge coefficient ($d_{33}$) of poled ceramics was measured at 100 Hz under 10 N force with a Berlincourt type $d_{33}$ meter. Planar electromechanical coupling coefficient ($k_p$) and mechanical quality factor ($Q_m$) were calculated according to IEEE standards from impedance spectra which was recorded by an impedance analyzer (HP-4294A, Impedance analyzer). After completing characterization, the devices were characterized with an oscilloscope and probes to investigate high voltage step-up capabilities.

The following discussion of the figures and composition and/or resulting PT properties for the inventive composition and processes are directed to specific, nonlimiting embodiments of the present invention.

E. Analysis and Discussion

1. Phase and Microstructure Analysis

FIG. 1 is a graph showing the X-ray diffraction (XRD) patterns of test PT devices comprised of the PNN-PMW-PZT, $0.08Pb(Ni_{1/3}Nb_{2/3})O_3$-$0.02Pb(Mg_{1/2}W_{1/2})O_3$-$0.90Pb(Zr_{0.50}Ti_{0.50})O_3$, materials taken both with and without $MnO_2$ dopant when sintered at 1000° C. for 2 hours. The samples showed a pure perovskite structure with an apparent (002)/(200) peak splitting, which confirms the tetragonal crystal structure. The XRD patterns also showed that $MnO_2$ content does not influence the phase structure.

Unless care is taken, second phase compounds like $Li_2PbO_3$ can form on the surface of 0.08PNN-0.02PMW-0.9PZT composition due to the $Li_2CO_3$ content exceeding the limit of solubility. Therefore, in embodiments, the amount of $LiCO_3$ is limited with 0.2 wt% as to eliminate such secondary phases. The XRD of calcined powder shows the composition exhibits rhombohedral, and tetragonal phases coexist in $MnO_2$ doped calcined powder (not shown); however, after sintering, the crystal structure changed to tetragonal phase.

FIGS. 2a-d are SEM micrographs of a cross-sectional fracture surface of both non-doped and doped PNN-PMW-PZT ceramics sintered at 1000° C. for 2 hours. As shown, there is no secondary phase or segregation in PNN-PMW-PZT ceramics shown in these SEM micrographs. These results are confirmed by XRD patterns (see FIG. 1). The SEM micrographs of PNN-PMW-PZT ceramics show dense microstructure and equiaxed grains without any abnormal grain growth. Also, the grain morphology was not changed with addition of $MnO_2$ modifiers.

Liquid phase sintering is a known process that is carried out below conventional sintering temperature due to the eutectic point that mixed metal oxides powder (i.e. $Li_2O_3$, CuO, PbO) with ceramic powder. The process uses a sintering aid $Li_2CO_3$ that reacts with PbO to form liquid phase with a low melting point of 836° C. Liquid phase sintering leads to rapid densification and shrinkage of PNN-PMW-PZT ceramics due to particle re-arrangement at an early stage of sintering. This result is shown in the granular liquid phase at grain boundaries in FIGS. 2(a) and 2(d). The $MnO_2$ additive influences the grain growth and density without exceeding the solubility limit due to Mn ions homogeneously dissolving in the perovskite structure as to enhanced the densification of the ceramics.

2. Electrical and Electromechanical Properties

The effect of $MnO_2$ doping content and sintering temperature profile on the electrical and electromechanical properties of PNN-PMW-PZT is that the mechanical quality factor ($Q_m$) increases significantly, whereas the coupling coefficient ($k_p$) and piezoelectric strain coefficient (d) decrease when $MnO_2$ modifiers are added. It was experimentally determined that the optimal piezoelectric properties for transformer device may be achieved with about 0.25 wt% $MnO_2$ doping. The hardening effect of $MnO_2$, which converted soft-type PNN-PMW-PZT ceramics to a hard-type, may be explained by stabilization of domain structure. Accordingly, Mn ions act as an acceptor dopant and can ionically compensate to create oxygen vacancies in the crystal lattice. The coexisting $Mn^{2+}$ and $Mn^{3+}$ of ions in perovskite PZT structure can easily dissolve to substitute preferentially occupied B-site or octahedral ions ($Zr^{4+}$, $Ti^{4+}$). Mn ions that occupy the lower valances site create oxygen vacancies ($V_{O''}$) to prevent electrical neutrality as given below:

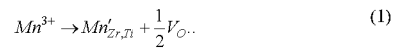

$$Mn^{3+} \rightarrow Mn'_{Zr,Ti} + \frac{1}{2}V_{O^{..}} \quad (1)$$

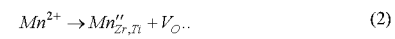

$$Mn^{2+} \rightarrow Mn''_{Zr,Ti} + V_{O^{..}} \quad (2)$$

Acceptor ions and oxygen vacancies lead to defect dipoles and/or distributed defect dipoles and these defects act as pinning points for the ferroelectric and ferroelastic domain motion/mobility which was pinned by defect dipoles by means of internal electrical field.

FIGS. 3a-b are graphs showing electromechanical and piezoelectric properties of PNN-PMW-PZT as a function of $MnO_2$ content sintered at 1000° C. for 6 hours (FIG. 3a); and PNN-PMW-PZT with 0.25 wt% $MnO_2$ as a function of sintering temperature (FIG. 3b). In embodiments, the sintering enables cofiring using inexpensive metals for electrode purposes, such as Ag/Pd, where it possesses low Pd content and, similarly even less expensive Cu metalizations. At a 1000° C. sintering temperature, the $MnO_2$ 0.25 wt% doped PNN-PMW-PZT ceramics exhibited excellent hard electromechanical properties of $d_{33}$=350 pC/N, $k_p$=0.63, and Qm=1150 making them attractive for high power applications, specifically for high power ceramic transformers.

Figure 4:
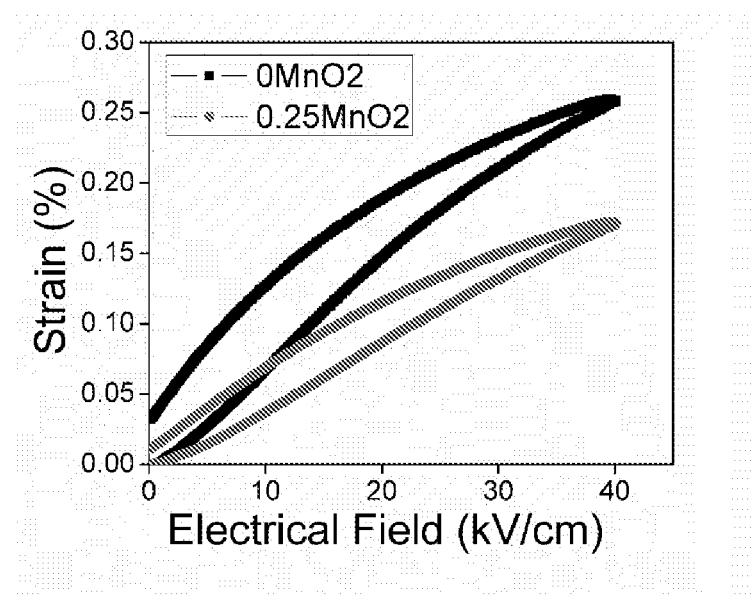
FIG. 4 is a graph showing unipolar strain curve (x-E) measurements of the PNN-PMW-PZT ceramic with 0.25 wt% doped $MnO_2$ and undoped sintered at 1000° C. for 2 hours.

FIG. 4 is a graph showing unipolar strain curves (x-E) of both non-doped and doped PNN-PMW-PZT ceramics as a function of electrical field which were applied at room temperature in silicone oil. Samples are sintered at 1000° C. for 2 h and poled under 3 kV/mm at 120° C. for 15 min. Non-doped PNN-PMW-PZT ceramics show higher strain than the 0.25 wt% MnO$_2$ doped ceramics attributable to domain wall motion.

The piezoelectric coefficient of the doped and undoped PNN-PMW-PZT ceramics were calculated to be 645 pC/N and 425 pC/N, respectively from the high field unipolar strain curve; whereas, the Berlincourt measurements provide 540 pC/N and 368 pC/N due to the absence of the extrinsic domain wall contribution under the higher fields.

Typical to a soft type ceramic, the non-doped version of the PNN-PMW-PZT composition exhibits high dielectric loss and relative permittivty; however, with the increase of Mn, loss and dielectric constant decrease which reflects the hardening effect (FIG. 5).

Analyzing the temperature dependence of the relative permittivity and dielectric loss, the Curie Temperature (Tc) was measured as 310° C. for undoped and 295° C. for MnO$_2$-doped PNN-PMW-PZT ceramics (FIGS. 6a-b). The non-doped PNN-PMW-PZT composition has higher relative permittivity at Tc, but exhibited a sharp and narrow ferroelectric-paraelectric phase transition. The MnO doped PNN-PMW-PZT ceramics exhibited a wider phase transition.

The Curie-Weiss law, provided as Equation 1 below, describes the diffuse phase transition in relaxor ferroelectrics with wider permittivity peaks and, where K is the dielectric constant at T, K$_{max}$ is the maximum value of the dielectric constant at T$_{max}$, $\gamma$ is the degree of diffuseness (or degree of dielectric relaxation in relaxor ferroelectric material) and C is a constant. $\gamma$ is a key parameter for a ferroelectric system to define as normal ferroelectric and relaxor ferroelectric.

$$\frac{1}{K} = \left(\frac{1}{K_{max}}\right) + \frac{\left[(T - T_{max})^\gamma\right]}{C} \quad (1)$$

The degree of diffuseness, $\gamma$, changes from 1 to 2, where 1 represents the normal ferroelectric phase transition behaviour that obey the Curie-Weiss law and 2 refers to relaxor ferroelectric with diffuse phase transtion behaviour. The degree of diffuseness of the PNN-PMW-PZT ceramics was calculated for different MnO$_2$ doping levels by use of Equation 1. It was determined that the y value of an undoped ceramic changes from 0.58 to 1.64, 1.63 and 1.82 corresponding to doping 0.1, 0.25 and 0.5 wt% MnO$_2$, respectively. This result indicates a relaxor ferroelectric behavior as shown in FIG. 7. In Pb (B'B")O$_3$ - PZT solid solutions, the B-site complex ions (B'B") increase the nanopolar domains instead of micron-sized local domains. In this case, the relaxor phase transition of PNN-PMW-PZT ceramics is associated with the PNN and PMW phases since they form the B-site complex ions, for example (Ni$_{1/3}$Nb$_{2/3}$)$^{4+}$ for PNN.

The polarization - electric field (P-E) curve and the electrical field induced bipolar strain hysteresis at 40 kV/cm of undoped PNN-PMW-PZT and 0.25 wt% MnO$_2$ doped PNN-PMW-PZT are shown in FIGS. 8a-8b, respectively. Undoped PNN-PMW-PZT showed a saturated hysteresis loop with remanent polarization of 34.3 µC/cm². The typical butterfly loop exhibits a ±0.25% bipolar-strain by non-180° domain switching due to the presence of a high electrical field. Both the remanent polarization (12.05 µC/cm²) and bipolar strain decreased in doped PNN-PMW-PZT due to the hardening effect caused by MnO$_2$ doping. The slightly pinched P-E curve and a non-symmetric bipolar-curve of the unpoled doped PNN-PMW-PZT is due to the defects (oxygen vacancies) interacting with domain walls under applied electrical field. In addition, defects and pinned or stabilized domains were aligned with local polarization vector increased the internal bias (Eint) of 0.25 wt% MnO$_2$ doped unpoled PNN-PMW-PZT ceramic to 1.29 kV/cm. The undoped unpoled PNN-PMW-PZT ceramic exhibits a lower internal bias (E$_{int}$= 0.55 kV/cm) than that of doped ceramics.

A MnO$_2$ dopant content of 0.25 wt% is more influential on the structure of the domain than the microstructure, which, in turn, largely determines the hard-piezoelectric properties that translate into higher power transformer capabilities.

3. Microstructural and Electrical Characterization of Multilayer PT

According to the present invention, PTs fabricated from the MnO$_2$ modified PNN-PMW-PZT piezoceramic compositions exhibit the high power material properties needed for manufacture of high power density PT devices. For larger gain ratios, in specific embodiments, the capacitance of primary (input) side may be larger than the capacitance of the secondary (output) side. In order to obtain large input capacitance compared to output capacitance of the planar ring-dot type PT, an input (ring) side may be constructed from thin piezoceramic layers with alternating polarization in thickness directions thereby providing high capacitance; whereas, an output (dot) side of the transformer may be a unified-body representing a significantly larger thickness (FIGS. 9a-b).

According to an embodiment of the present invention, the low temperature sinter compositional materials underwent a multilayer co-fire process to yield PT devices of ratio of capacitance of the 3.6 mm wide multilayer ring-shape primary side (C$_p$=42 nF) to the capacitance of the 5 mm dot-shape single layer secondary side (C$_s$=280 pF), representing a large gain of 150.

PTs fabricated using the composition and manufacture processes of the present invention show dense microstructures void of delamination and exhibiting uniform ceramic-electrode interface. This is verified by the SEM image of a fractured surface provided in FIGS. 10a-c. The ceramic and electrode layer thicknesses of PT were measured to be 105 µm and 5 µm, respectively (FIG. 10a). The morphology of grains in the co-fired multilayer PTs in FIG. 10b is similar to the morphology of grains in bulk samples provided in FIG. 2, confirming the co-fired sintering conditions. Energy Dispersive Spectroscopy (EDS) mapping of FIG. 10c shows that there is an absence of cross-diffusion between the metal electrode and ceramic layers and thus, a clean metal-ceramic interface is achieved using these processes for the PNN-PMW-PZT compositions.

FIGS. 11a-b show the impedance and phase spectrum of the input (FIG. 11a) and output side (FIG. 11b) of the sample PTs comprised of the PNN-PMW-PZT ceramic composition taken at two extreme loading conditions (open and short).

The impedance and phase spectra shown in FIGS. 11a-b show full polarization of the devices at both input and output sides as phase is larger than 80°. FIGS. 11a-b also shows that the coupling coefficient of input side is larger than output side. In addition to the impedance-phase spectrum analysis at two extreme electrical loading cases, the devices of the present invention also demonstrated the effect of electrical loading (resistance) on impedance and phase to represent similar conditions with high power measurements.

FIGS. 12a-b show input phase (top, FIG. 12a) and impedance (bottom, FIG. 12b) spectrum of the device when output is connected to different loads. The dampening effect of the electrical load is seen in impedance and phase plots, as the device is loaded different than open circuit (R$_{load}$ = ∞)

and short circuit ($R_{load}$ = 0) conditions. The optimum (matching) load was determined to occur at 3 kΩ; this corresponds to where the damping effect is at maximum at both impedance and phase.

The test piezoelectric transformers samples underwent high-power characterization using their matching loads (~3 kΩ) when driven by sinusoidal (AC) input signal at operating frequencies between resonance ($f_r$) and anti-resonance ($f_{ar}$) of the fundamental mode, where the power efficiency ($P_{out}/P_{in}$) is maximized.

Figure 13:
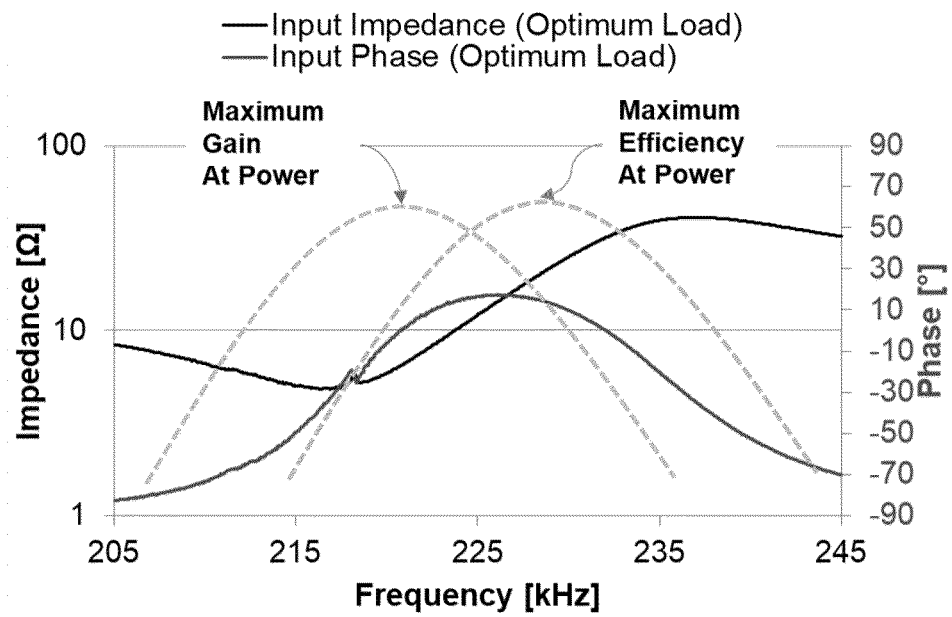
FIG. 13 is a graph showing the gain and efficiency characteristics of an optimally loaded piezoelectric transformer comprised of the PNN-PMW-PZT composition shown with the small signal impedance and phase spectrum.

Frequencies where the maximum gain and power are observed are illustrated by using an impedance-phase spectrum plot of an optimally loaded device as shown in FIG. 13. Maximum gain occurs around the resonance frequency (minimum impedance) and maximum efficiency occurs around where phase is maximum at small signal (low power) tests.

High power measurements were taken at specific output power ($P_{out}$) levels (e.g., 1 W, 2 W, 3 W) and limited over the frequency range as described above as to limit the maximum temperature increase (ΔT) of devices to only 40° C.

Figure 14:
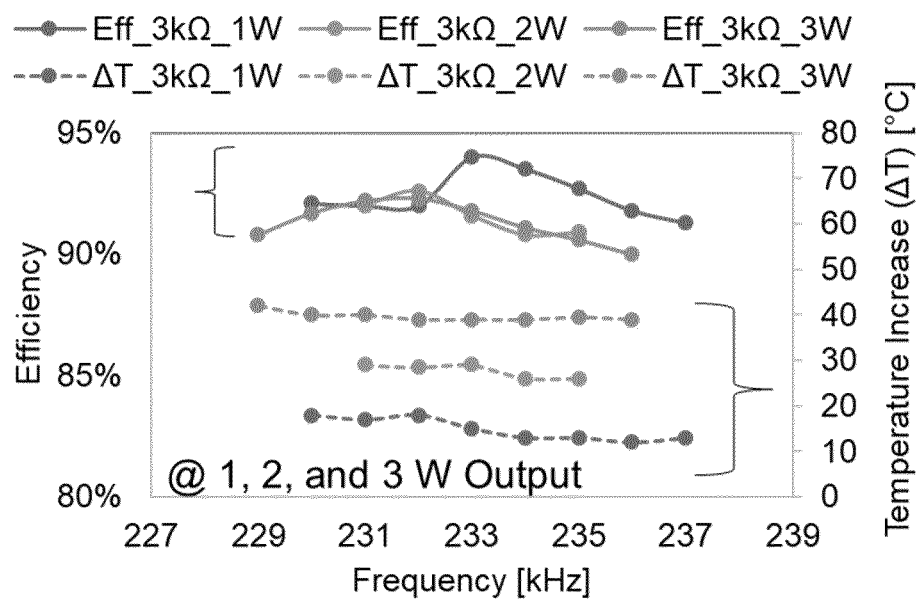
FIG. 14 is a graph showing efficiency and temperature increase of piezoelectric transformers comprised of the PNN-PMW-PZT composition as a function of operating frequency and output power.

FIG. 14 shows the efficiency and associated temperature increase of the 10 mm OD, 1 mm thick (Volume=78 mm³) piezoelectric transformer comprised of the compositional material of the present invention when connected to its optimal load (3 kΩ) and providing 1, 2 and 3 W output which corresponds to power densities of 12.7, 25.5 and 38.2 W/cm³, respectively. FIG. 14 indicates that power density is directly related to the maximum allowable temperature increase from ambient temperature (ΔT) and thus higher power densities can be obtained at higher ΔT.

4. Reduced Atmosphere Sintering of PNN-PMW-PZT Piezoceramics

The performance of $0.08Pb(Ni_{1/3}Nb_{2/3})O_3$ - $0.02Pb(Mg_{1/2}W_{1/2})O_3$ - $0.90Pb(Zr_{0.50}Ti_{0.50})O_3$ piezoceramics under low partial pressure of oxygen (low $pO_2$)/reducing atmosphere sintering conditions were evaluated for their feasibility regarding copper co-firing technology.

Lead-based piezoceramics suffer from lead loss during sintering at elevated temperatures. This phenomenon can cause undesirable changes in the stochiometry and structure and can have an impact on the final properties of the piezoceramic. Under reducing conditions, this effect may be amplified due to the purge gas flow. Indeed, the development of this invention initially encountered this problem and had densification issues for the PNN-PMW-PZT piezoceramics under reduced atmosphere sintering conditions. To overcome this problem excess PbO, in specific embodiments from about 0 to about 1.5 wt% excess PbO, was added into the calcined composition.

The PNN-PMW-PZT piezoceramics were prepared by conventional mixed oxides method. After ball mixing, the powders were calcined at 780° C. for 4 h. Then calcined powder was milled along with excess 1.5 wt% PbO for 24 h to reduce particle size and compensate the lead loss during sintering. The milled powder was then pressed into disk pellets with 12 mm diameter by uniaxially pressing and using binder to increase compaction. After removal of the binder at 550° C., samples were sintered at various reducing atmosphere conditions. After polishing and lapping PNN-PMW-PZT disk samples were poled in silicone oil bath at 120° C. under 3 kV/mm for 15 min. Then, the overall properties of the samples were subsequently measured at room temperature 24 h after (aged) poling.

Figure 15:
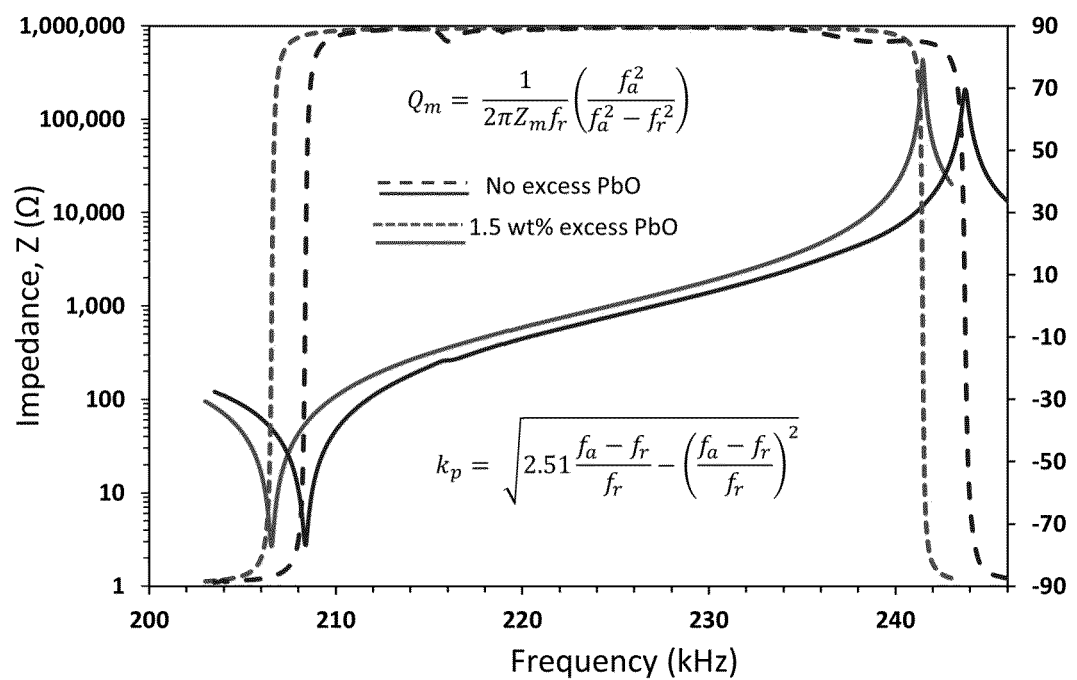
FIG. 15 is a graph showing impedance spectra of PNN-PMW-PZT piezoceramic sintered at 1000° C. for 2 hours under ambient conditions with and without excess PbO.

The analysis of the properties included a side-by-side study on the effect of excess PbO. For this purpose, PNN-PMW-PZT piezoceramics with and without 1.5 wt% excess PbO were sintered at 1000° C. for 2 h. The impedance spectra of and 1.5 wt% excess PbO PNN-PMW-PZT ceramics are provided in FIG. 15. The resonance and anti-resonance frequencies were slightly shifted to lower values. This shift could be related to slight softening in the excess PbO ceramics since their sizes were almost identical. However, high power properties calculated from the impedance spectra such as the mechanical quality factor ($Q_m$) and electromechanical coupling coefficient ($k_p$) did not change significantly (Table 2). Moreover, overall properties of the piezoceramics were quite similar to each other.

TABLE 2

The effect of excess PbO on the overall properties of PMN-PMW-PZT piezoceramics sintered at 1000° C. for 2 h

| Excess PbO (wt%) | $Q_m$ | $k_p$ | $d_{33}$ (pC/N) | Max Phase Angle (θ) | tan δ | tan δ (virgin) |
|---|---|---|---|---|---|---|
| 1.5 | 1100 | 0.63 | 344 | 89.5 | 0.0043 | 0.0050 |
| 0 | 1085 | 0.63 | 342 | 89.4 | 0.0030 | 0.0056 |

Figure 16:
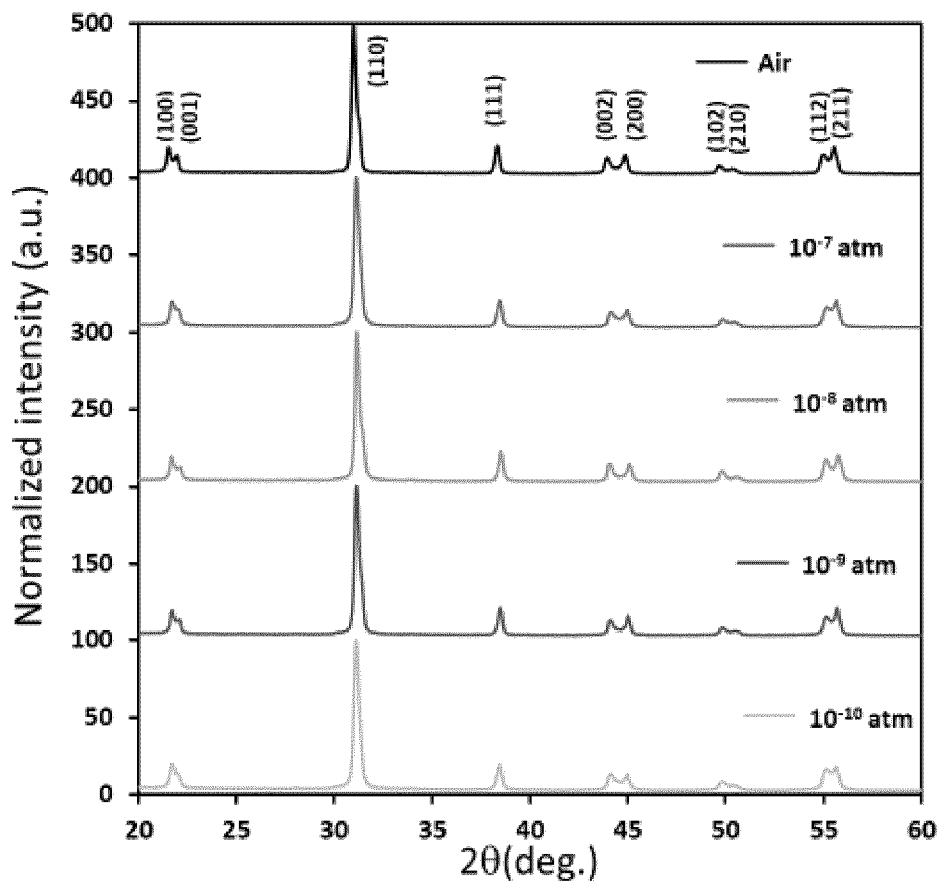
FIG. 16 is a graph showing the XRD pattern of the PNN-PMW-PZT ceramic sintered at 1050° C. for 2 h under differing $pO_2$ conditions.

The XRD patterns of PNN-PMW-PZT piezoceramics sintered at 1050° C. for 2 h under different atmospheric conditions are shown in FIG. 16. All of the samples showed a pure perovskite structure with an obvious (002)/(200) peak splitting, which confirmed the tetragonal crystal structure. It was found that PNN-PMW-PZT can sustain a single perovskite phase with wide range of reducing atmosphere conditions.

Figure 17:
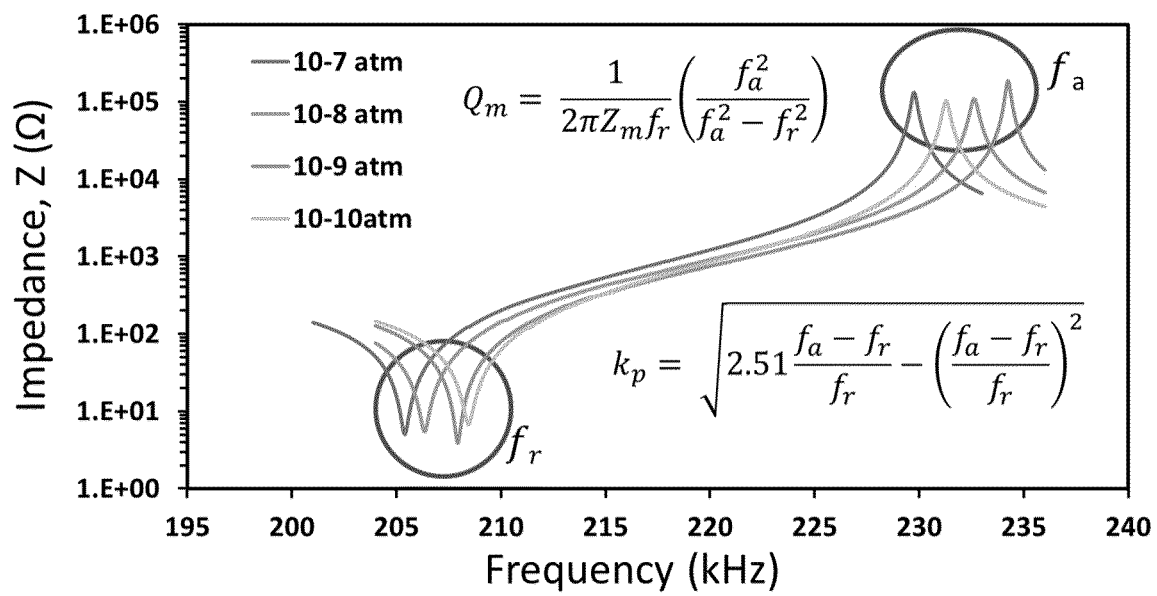
FIG. 17 is a graph showing resonance and anti-resonance spectra of the PNN-PMW-PZT composition sintered at 1050° C. for 2 hours under differing $pO_2$ conditions.

The effect of reduced atmosphere sintering on the electrical and electromechanical properties of PNN-PMW-PZT was calculated from the impedance/resonance curves (FIG. 17). The mechanical quality ($Q_m$) and planar coupling ($k_p$) factors were calculated via the equations 2 and 3.

$$Q_m = \frac{1}{2\pi Z_m f_r} \left( \frac{f_a^2}{f_a^2 - f_r^2} \right) \quad (2)$$

$$k_p = \sqrt{2.51 \frac{f_a - f_r}{f_r} - \left( \frac{f_a - f_r}{f_r} \right)^2} \quad (3)$$

wherein $f_r$ and $f_a$ are resonance and antiresonance frequencies, respectively, and $Z_m$ is the impedance at resonance frequency.

It was found that decreasing $pO_2$ from $10^{-7}$ atm to $10^{-9}$ atm shifted the resonance frequencies to higher values. Since the resonance frequencies are directly proportional to the stiffness of the piezoceramic, low $pO_2$ conditions may cause mechanical stiffening in the piezoceramic. In addition, the resonance bandwidth of the piezoceramics sintered at $10^{-10}$ atm was slightly narrower than the others, which correlated to a smaller coupling factor ($k_p$) (Table 3).

Overall performance characteristics of the PNN-PMW-PZT piezoceramic composition as a function of atmospheric conditions ($pO_2$) are provided in Table 3. Except extremely low $pO_2$ conditions (i.e., $pO_2=1\times10^{-10}$ atm), the coupling coefficient ($k_p$) and piezoelectric constant ($d_{33}$) increased as a function of decreasing $pO_2$. Mechanical quality factor ($Q_m$) and dielectric loss (tan δ) heavily rely on the defect mechanisms in the structure and are therefore more complex to explicate under reducing conditions, especially. Overall, PNN-PMW-PZT piezoceramics can be sintered under reducing atmosphere, for example, with $pO_2 = 1\times10^{-9}$ atm. However, the measurements taken were unable to match the performance of samples sintered in ambient atmosphere.

TABLE 3

Effect of different $pO_2$ sintering on PbO Loss, density, and hard piezoelectric properties of PMN-PMW-PZT ceramics sintered at 1050° C. for 2 h

| $pO_2$ (atm) | Sintering Temperature (°C) | PbO loss (wt%) | Density (g/cm³) | $Q_m$ | $k_p$ | $d_{33}$ (pC/N) | Max Phase Angle (θ) | tan δ |
|---|---|---|---|---|---|---|---|---|
| Air | 1000 | 2.8 | 7.75 | 1100 | 0.63 | 344 | 89.5 | 0.0043 |
| $1 \times 10^{-7}$ | 1050 | 2.8 | 7.73 | 715 | 0.51 | 305 | 88.9 | 0.0031 |
| $1 \times 10^{-8}$ | 1050 | 3.3 | 7.81 | 642 | 0.52 | 312 | 88.4 | 0.0031 |
| $1 \times 10^{-9}$ | 1050 | 2.8 | 7.72 | 910 | 0.52 | 312 | 89.1 | 0.0031 |
| $1 \times 10^{-10}$ | 1050 | 3.4 | 7.74 | 572 | 0.49 | 312 | 88.2 | 0.0031 |

Figure 18:
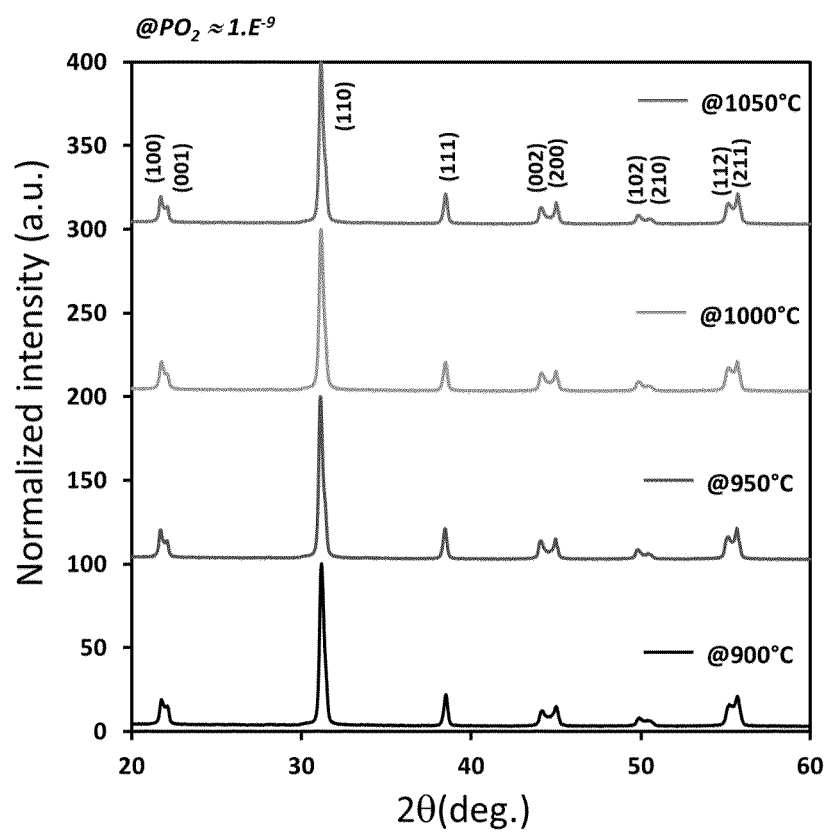
FIG. 18 is a graph showing XRD patterns of the PNN-PMW-PZT composition sintered under reducing ($pO_2$=10$^{-9}$ atm) conditions as a function of sintering temperature.

The XRD patterns of PNN-PMW-PZT piezoceramics sintered under $pO_2=10^{-9}$ atmosphere and at various sintering temperatures are shown in FIG. 18. At all sintering temperatures, the samples were formed a pure perovskite phase with tetragonal peak splitting. Although the sintering temperature resulted in only slight influence on the perovskite tetragonal phase, notable changes on electrical properties were observed.

Figure 19:
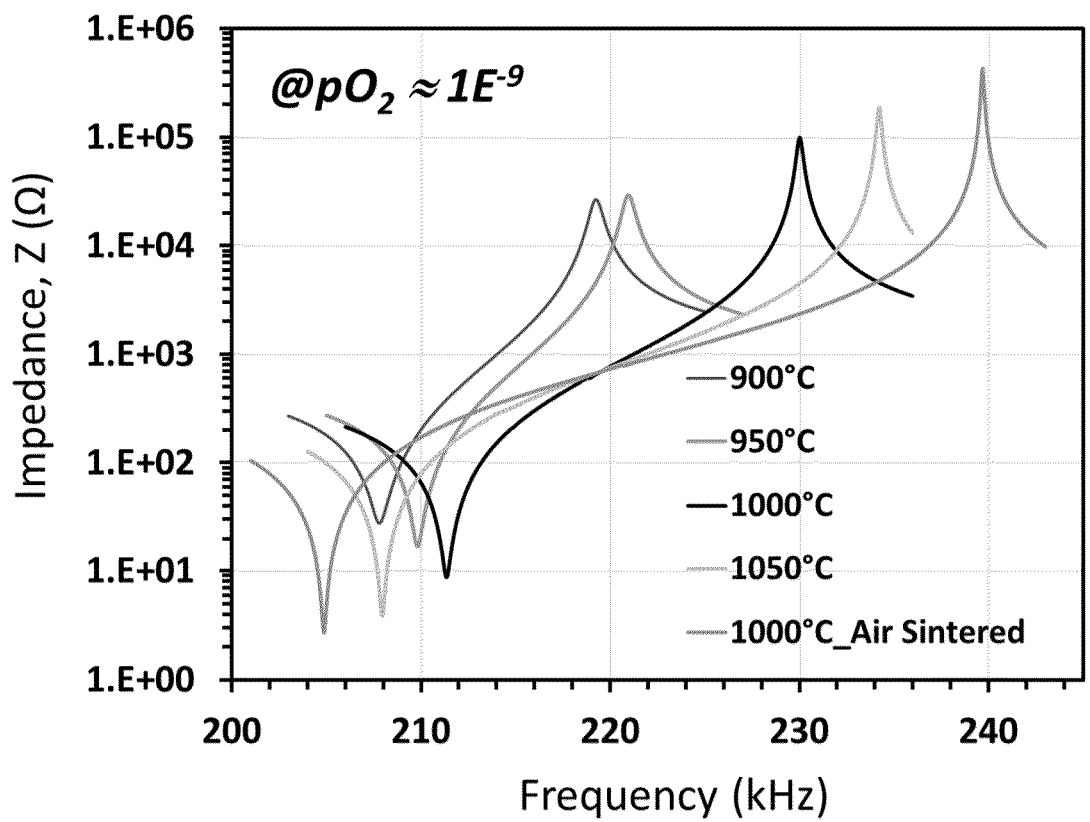
FIG. 19 is a graph showing resonance and anti-resonance spectra of the PNN-PMW-PZT ceramic sintered at under $pO_2$ of 10$^{-9}$ atm at different sintering temperature.
Figure 20:
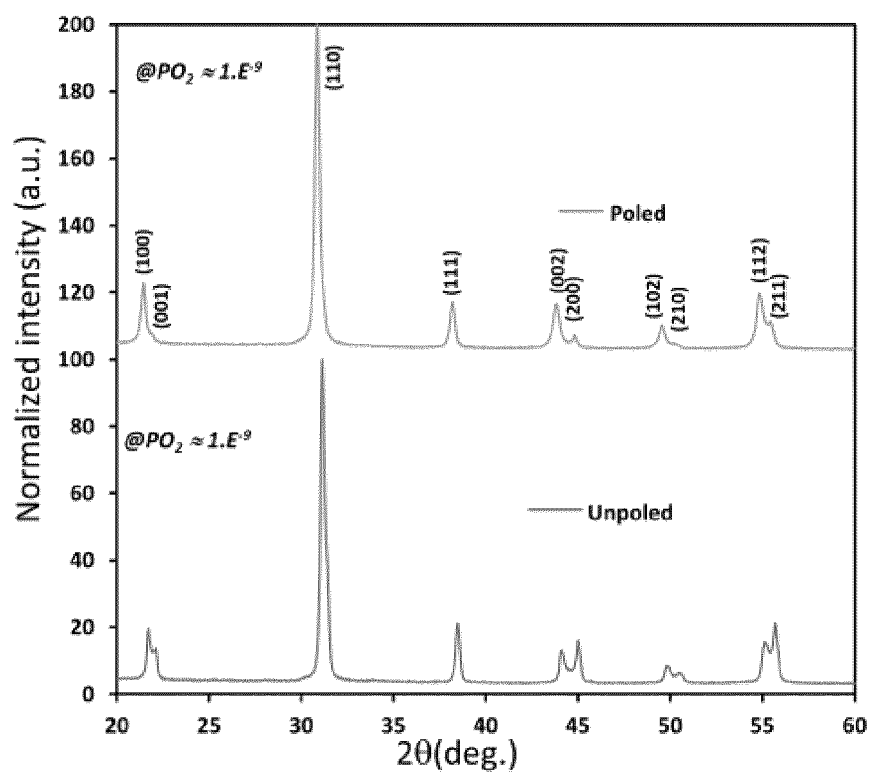
FIG. 20 is a graph showing XRD pattern of poled and unpoled PNN-PMW-PZT ceramic sintered at 1050° C. under $pO_2$ of 10$^{-9}$ atm.

The PNN-PMW-PZT ceramics were sintered between 900-1050° C. under $pO_2 = 10^{-9}$ atm to investigate the effect of sintering temperature on electromechanical properties. The air sintered ceramic has a broad impedance spectrum compared to the reduce atmosphere sintered ceramics (FIG. 19). The mechanical quality ($Q_m$) and electromechanical ($k_p$) factors were calculated from these spectra and the results are given in Table 4. When the sintering temperature decreased starting from 1000° C., resonance and anti-resonance curves of Mn-modified PNN-PMW-PZT ceramics became broadened and the frequency bandwidth (resonance and anti-resonance) narrowed. These results show that $Q_m$ and $k_p$ both decreased for sintering temperatures below 1000° C.

Table 4 shows that the optimum properties occur for sintering temperatures around 1000-1050° C. Therefore, this temperature range is suitable for Cu co-firing. At 1050° C. under $pO_2$ of $10^{-9}$, $MnO_2$ 0.25 wt% doped PNN-PMW-PZT ceramics still exhibited hard piezoelectric properties of $d_{33}$=312 pC/N, $k_P$=0.52, and $Q_m$=910. The ambient sintered 0.25 wt% doped PNN-PMW-PZT piezoceramics also retained their excellent electrical properties compared to the reduced atmosphere sintered piezoceramics. Although the PbO loss and density of ambient and reduced atmosphere sintered ceramics had the same trend at both 900° C. and 1050° C., $Q_m$, $k_p$, and $d_{33}$ increased from 280, 0.36 and 223 pC/N to 910, 0.52, 312 pC/N, respectively. Also, the dielectric loss of doped PNN-PMW-PZT ceramics were similar except the ambient sintered ceramics. In ambient sintering conditions Mn ions can be easily dissolved in the perovskite structure as $Mn^{2,3+}$ valences and create oxygen vacancies.

Although only certain embodiments of the invention have been illustrated in the foregoing specification, it is understood by those skilled in the art that many other modifications and embodiments of the invention will benefit from the invention.

It is therefore understood that the invention is not limited to the specific embodiments disclosed herein, and that many modifications and other embodiments of the invention are intended to be included within the scope of the invention. Moreover, although specific terms are employed herein, they are used only in a generic and descriptive sense, and not for the purposes of limiting the description of the invention.

The invention claimed is:

1. A composition, comprising:
   a Pb/Ni/Nb - Pb/Mg/W - Pb/Zr/Ti mixed oxide; and
   0.1 to about 0.5 wt.% $MnO_2$, based on the weight of the composition.

2. The composition of claim 1, wherein the mixed oxide is modified or doped with a rare earth metal oxide.

3. The composition of claim 1, comprising $Pb(Ni_{1/3}Nb_{2/3})O_3$-$Pb(Mg_{1/2}W_{1/2})O_3$-$Pb(Zr_{0.50}Ti_{0.50})O_3$.

4. The composition of claim 1, comprising about 0.25 wt% $MnO_2$.

5. The composition of claim 1, comprising $0.08Pb(Ni_{1/3}Nb_{2/3})O_3$ - $0.02Pb(Mg_{1/2}W_{1/2})O_3$ - $0.90Pb(Zr_{0.50}Ti_{0.50})O_3$.

6. The composition of claim 1, further comprising $Li_2CO_3$ and $CaCO_3$.

7. The composition of claim 1, further comprising an excess of PbO.

8. A method of making a piezoelectric device, comprising:
   providing at least two first layers, each first layer coated with an outer electrode material;
   providing a plurality of second layers, each second layer coated with an inner electrode material; said at least two first layers and said plurality of second layers each comprising a Pb/Ni/Nb - Pb/Mg/W - Pb/Zr/Ti mixed oxide;

TABLE 4

The effect of the sintering temperature on PbO loss, density, and hard piezoelectric properties of PMN-PMW-PZT piezoceramics under $pO_2=10^{-9}$ atm

| Sintering Temperature (°C) | PbO loss (wt%) | Density (g/cm³) | $Q_m$ | $k_p$ | $d_{33}$ (pC/N) | Max Phase Angle (θ) | tan δ |
|---|---|---|---|---|---|---|---|
| 900 | 2.45 | 7.84 | 280 | 0.36 | 223 | 84.4 | 0.0055 |
| 950 | 2.86 | 7.81 | 481 | 0.35 | 208 | 86.2 | 0.0030 |
| 1000 | 2.83 | 7.86 | 602 | 0.45 | 314 | 88.2 | 0.0024 |
| 1000 (Air) | 2.82 | 7.75 | 1100 | 0.63 | 344 | 89.5 | 0.0043 |
| 1050 | 2.80 | 7.72 | 910 | 0.52 | 312 | 89.1 | 0.0025 | combining or stacking a plurality of second layers coated with inner electrode materials between two first layers coated with outer electrodes; and sintering or co-firing the stacked inner electrode materials and outer electrode materials at a temperature at or below about 1000° C.

9. The method of claim 8, wherein the piezoelectric device is a ring-dot piezoelectric transformer.

10. The method of claim 8, wherein the piezoelectric device is a Rosen transformer.

11. The method of claim 8, wherein the inner electrode material comprises at least one of Ag, Pd, Cu, alloys thereof, or combinations thereof.

12. The method of claim 8, wherein the inner electrode material comprises Cu or alloys thereof.

13. The method of claim 8, wherein the piezoelectric device is a ring-dot piezoelectric transformer having a thickness of about 1 mm and a diameter of about 10 mm.

14. The method of claim 8, wherein the sintering is accomplished in a reducing atmosphere having $pO_2$ from $10^{-15}$ to $10^{-1}$ atm.

15. The method of claim 8, wherein the sintering is accomplished in a reducing atmosphere having $pO_2$ of about $1 \times 10^{-9}$ atm.

16. A piezoelectric device formed according to claim 8, wherein the device comprises sintered or co-fired at least two first layers and a plurality of second layers each comprising a Pb/Ni/Nb - Pb/Mg/W - Pb/Zr/Ti mixed oxide and 0.1 to about 0.5 wt.% $MnO_2$.

17. The piezoelectric device of claim 16, said device comprising a sensor, a transformer, or a transducer.

18. The piezoelectric device of claim 16, said device comprising a ring-dot or Rosen transformer.

19. A multilayer piezoelectric device comprising a sintered composition of claim 1.

20. The composition of claim 1, wherein a mechanical quality factor, $Q_m$, of the composition is from 910 to 1150.

21. The composition of claim 1, wherein a piezoelectric charge coefficient, $d_{33}$, of the composition is from 312 to 350 pC/N.

* * * * *